United States Patent [19]
Tanaka et al.

[11] Patent Number: 4,912,741
[45] Date of Patent: Mar. 27, 1990

[54] HEATING BOX FOR A MICROWAVE OVEN

[75] Inventors: Yuji Tanaka, Gose; Shuji Nagao, Nabari; Takeshi Nakagawa; Tetsuji Ono, both of Nara, all of Japan

[73] Assignee: Matsushita Electric Industrial Co., Ltd., Osaka, Japan

[21] Appl. No.: 225,421

[22] Filed: Jul. 28, 1988

[30] Foreign Application Priority Data

Jul. 31, 1987 [JP] Japan ................... 62-192934

[51] Int. Cl.⁴ ............................................. H05B 6/64
[52] U.S. Cl. ...................... 219/10.55 R; 219/10.55 B; 126/190
[58] Field of Search .............. 219/10.55 R, 10.55 B, 219/10.55 E, 10.55 D; 126/190, 200; 29/514, 505; 174/17 R, 17.08

[56] References Cited

U.S. PATENT DOCUMENTS

| 4,255,640 | 3/1981 | Bressler | 219/10.55 B |
| 4,504,717 | 3/1985 | Arai | 219/10.55 E |
| 4,597,374 | 7/1986 | Igarashi | 219/10.55 R |
| 4,609,801 | 9/1986 | Spencer et al. | 219/10.55 R |
| 4,680,439 | 7/1987 | Millman | 219/10.55 R |
| 4,788,395 | 11/1988 | Sakoda | 219/10.55 R |

FOREIGN PATENT DOCUMENTS

| 11148/78 | 8/1977 | Australia . |
| 32841/78 | 1/1978 | Australia . |
| 37841/78 | 1/1980 | Australia . |
| 21454/83 | 6/1984 | Australia . |

Primary Examiner—Philip H. Leung
Attorney, Agent, or Firm—Lowe, Price, LeBlanc, Becker & Shur

[57] ABSTRACT

A heating box has an interior exposed to microwave energy. The heating box includes a first metal panel and a second metal panel. The first panel has a join portion. The second panel has a join portion which opposes and contacts the join portion of the first panel. The first panel and the second panel are bonded together at the join portions thereof. A plurality of electrical connections between the first and second panels extend in the join portions of the first and second panels. The electrical connections are spaced.

19 Claims, 5 Drawing Sheets

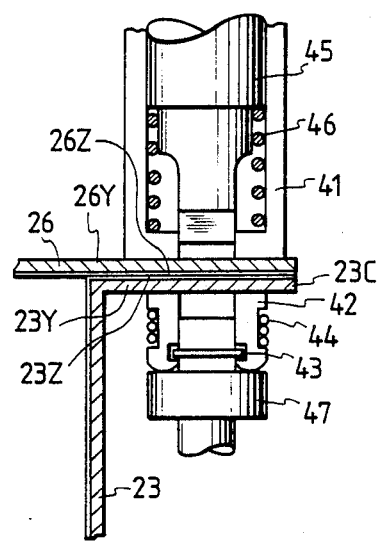
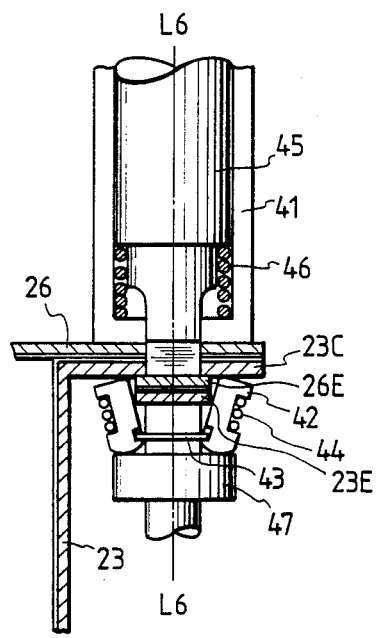
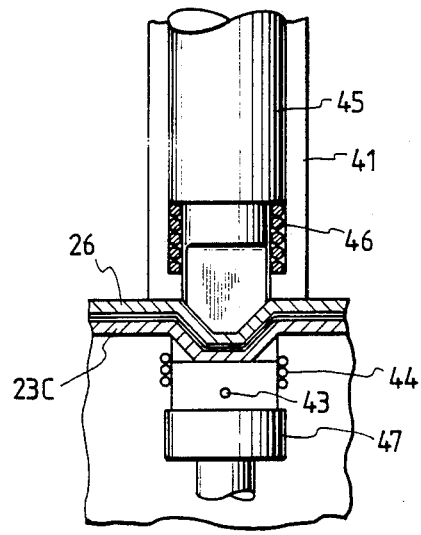

4,912,741

HEATING BOX FOR A MICROWAVE OVEN

BACKGROUND OF THE INVENTION

This invention relates to a heating box or an internal box usable in microwave cooking appliances such as a microwave oven or an electronic range.

Microwave ovens have a casing which accommodates a heating box or an internal box. The heating box is usually required to have adequate mechanical strength. In addition, it is desirable that the heating box effectively prevents leakage of energy.

SUMMARY OF THE INVENTION

It is an object of this invention to provide a strong heating box.

It is another object of this invention to provide a heating box which effectively prevents microwave energy leakage.

A heating box according to this invention includes a first metal panel and a second metal panel. The first panel has a joint portion. The second panel has a joint portion which opposes and contacts the join portion of the first panel. The first panel and the second panel are bonded together at the joint portions thereof by bonding means comprising means for mechanically connecting the first and second panels, and means for electrically connecting the first and second panels, wherein said mechanically connecting means comprises opposing parts extending between two lines along which said joint portions of the first and second panels are cut and forcibly deformed together away from said joint portions such that said forcible deformation causes a mechanical connection of said first and second panels thereat, and wherein said electrically connecting means extends across the thickness of said cut and deformed opposing parts of said joint portions of the mechanically connected first and second panels. A plurality of electrical connections between the first and second panels extend in the join portions of the first and second panels. The electrical connections are spaced.

BRIEF DESCRIPTION OF THE DRAWINGS

FIGS. 4 and 5 are sectional views of a portion of the heating box of FIG. 2 and devices for producing the bonding section of FIG. 3.

FIG. 6 is a sectional view taken along the line L6—L6 of FIG. 5.

DESCRIPTION OF THE FIRST PREFERRED EMBODIMENT

Figure 1:
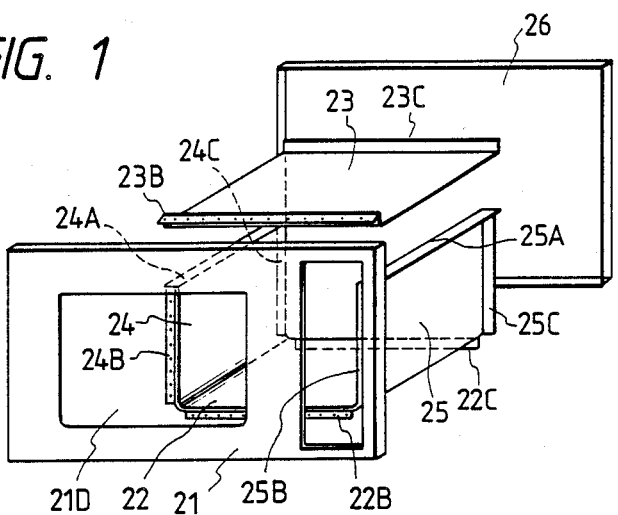
FIG. 1 is an exploded perspective view of a heating box according to a first embodiment of this invention under conditions which occur before processes of bonding panels are performed.
Figure 2:
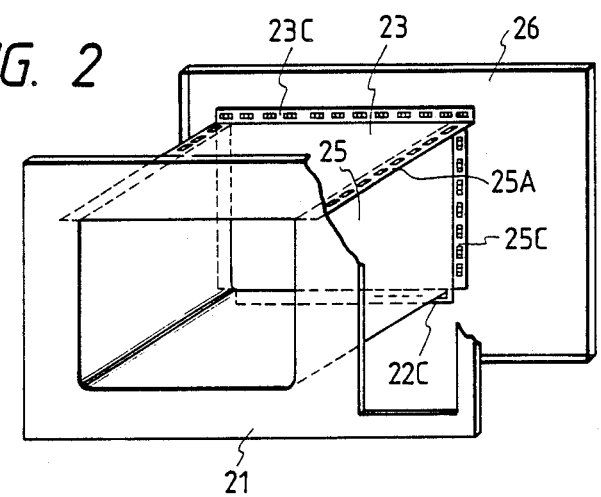
FIG. 2 is a perspective view of the heating box of the first embodiment under conditions where the panel bonding processes are completed and the heating box is assembled.

With reference to FIGS. 1 and 2, a heating box or an internal box of a microwave oven includes a front panel 21, a floor panel or a lower panel 22, an upper panel 23, opposing side panels 24 and 25, and a rear panel 26.

The lower panel 22 and the side panels 24 and 25 are integral with each other, forming a U-shaped member. The side panels 24 and 25 are fixed or bonded to the upper panel 23 via flanges 24A and 25A formed on upper edges of the side panels 24 and 25 respectively. The lower panel 22, the upper panel 23, and the side panels 24 and 25 are fixed or bonded to the front panel 21 via flanges 22B, 23B, 24B, and 25B formed on front edges of the panels 22, 23, 24, and 25 respectively. The lower panel 22, the upper panel 23, and the side panels 24 and 25 are fixed or bonded to the rear panel 26 via flanges 22C, 23C, 24C, and 25C formed on rear edges of the panels 22, 23, 24, and 25 respectively. The flanges of the panels 22-25 form join portions opposing and contacting portions of the panels 21, 23, and 26 which define corresponding join portions.

The panels 21-26 are connected in the form of a box. The panels 22-26 define an internal space or a cooking chamber of a rectangular parallelepiped the interior of which is exposed to microwaves. The front panel 21 has a rectangular opening 21D in communication with and in register with the cooking space in the interior of the box.

The panels 21-26 are composed of coated steel plates such as coated stainless steel plates or laminate steel plates having coats of resin. Each of the steel plates forming the panels 22-26 has opposite surfaces coated and uncoated respectively. The panels 22-26 are arranged so that coats on the panels 22-26 oppose the cooking space. In other words, the cooking space is defined by the coated surfaces of the panels 22-26. The outer surfaces of the panels 22-26 have no coat.

The connections between the panels 21-26 are all designed and performed in similar manner. The connection between the upper panel 23 and the rear panel 26 will be described in more detail hereinafter.

Figure 3:
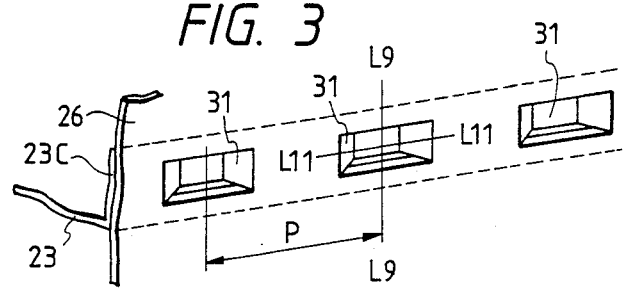
FIG. 3 is a perspective view of a portion of the heating box of FIG. 2.

As shown in FIG. 3, the flange 23C of the upper panel 23 contacts the rear panel 26. The upper panel 23 and the rear panel 26 are fixed together at rectangular recessed bonding sections 31 extending in the flange 23C of the upper panel 23 and the corresponding part of the rear panel 26. The bonding sections 31 are spaced at equal pitches P in a longitudinal direction of the flange 23C. The pitch P between the bonding sections 31 is preferably smaller than a quarter wavelength of microwave used in the oven. As will be made clear hereinafter, the bonding sections 31 are formed in a method including a cutting process, a drawing process, and a forced plastic deformation process.

During the formation of the bonding sections 31, as shown in FIG. 4, the flange 23C of the panel 23 and the panel 26 are brought into contact and then the flange 23C of the panel 23 and the corresponding part of the panel 26 are sandwiched between a holder 41 and jaws 42. A metal wall 23Y of the flange 23C of the panel 23 and a metal wall 26Y of the panel 26 are separated by a coat 23Z of the panel 23 and a coat 26Z of the panel 26. Under the conditions of FIG. 4, the coats 23Z and 26Z prevent electrical connection between the panels 23 and 26.

Figure 7:
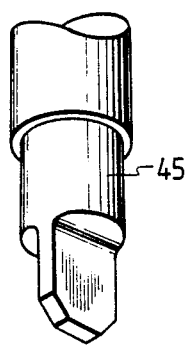
FIG. 7 is a perspective view of the punch of FIGS. 4-6.
Figure 8:
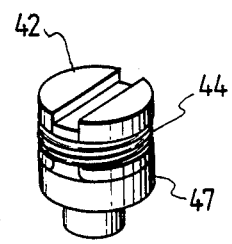
FIG. 8 is a perspective view of the combination of the jaws, the spring, and the die of FIGS. 4-6.

The holder 41 accommodates a punch 45. As shown in FIG. 7, the punch 45 has a trapezoidal working end. As shown in FIGS. 4 and 8, the jaws 42 are supported on a die 47 and are mutually connected via a spring 44. The jaws 42 are rotatable about a roll pin 43. The jaws 42 are normally held by the spring 44 in positions where the jaws 42 form a cylinder whose end has a diametrical groove 42A.

As shown in FIGS. 5 and 6, the punch 45 is moved downward against the force of a spring 46, meeting the panels 23 and 26 and cutting them along lines corresponding to longer sides of a rectangle of each bonding section 31. During the downward movement, the punch 45 bends downward the portions of the panels 23 and 26 corresponding to shorter sides of the rectangle of each bonding section 31 and also displaces downward portions 23E and 26E of the panels 23 and 26 between the cut lines. After the displaced portions 23E and 26E of the panels 23 and 26 reach positions extending downward of the rest of the panels 23 and 26, the displaced portions 23E and 26E of the panels 23 and 26 are pressed between the punch 45 and the die 47. This pressing process plastically deforms the displaced portions 23E and 26E of the panels 23 and 26 and expands them outward along directions parallel to the flange 23C of the panel 23 and the panel 26. As the displaced portions 23E and 26E of the panels 23 and 26 expand outward, the jaws 42 rotate outward about the roll pin 43 against the force of the spring 44.

The displaced portions 23E and 26E of the panels 23 and 26 are thus made larger in width than the opening of the rest of the panels 23 and 26 between the cut lines. Edges of the displaced portion 26E of the panel 26 engage the non-displaced portion of the panel 23, producing mechanical bonding between the panels 23 and 26 and thus preventing separation between the panels 23 and 26.

Figure 9:
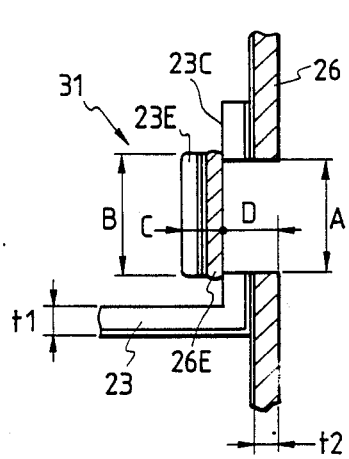
FIG. 9 is a sectional view taken along the line L9—L9 of FIG. 3.

As shown in FIG. 9, in the bonding section 31, the cut opening in the non-displaced portions of the panels 23 and 26 has a width A. The portions 23E and 26E of the panels 23 and 26 were displaced by a distance D corresponding to a depth of the cut opening. The displaced and deformed portions 23E and 26E has a width B and a thickness C. The non-displaced portion of the panel 23 has a thickness t1. The non-displaced portion of the panel 26 has a thickness t2. The width B of the displaced and deformed portions 23E and 26E of the panels 23 and 26 is preferably chosen so as to satisfy the following relationship.

$$B \geq A + \{2(t1+t2)/3\}$$

The thickness C of the displaced and deformed portions 23E and 26E of the panels 23 and 26 is preferably chosen so as to satisfy the following relationship.

$$C \leq 0.8(t1+t2)$$

The depth D is preferably chosen so as to essentially equal to the sum of the thicknesses t1 and t2.

Figure 10:
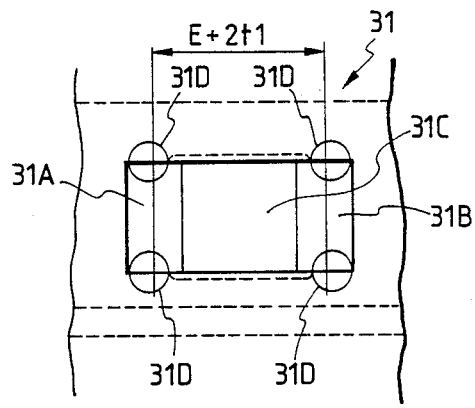
FIG. 10 is a plan view of the bonding section of FIG. 9.
Figure 11:
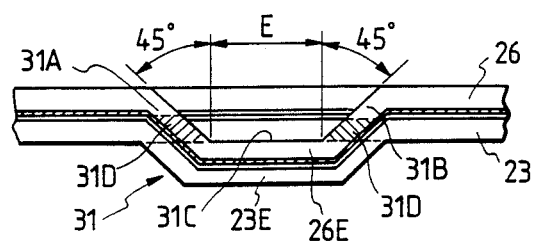
FIG. 11 is a sectional view taken along the line L11—L11 of FIG. 3.

As shown in FIGS. 10 and 11, the bonding section 31 has a recessed structure having a pair of sides 31A and 31B and a rectangular flat bottom 31C defined by the displaced and deformed portions 23E and 26E of the panels 23 and 26. The bottom 31C extends between the sides 31A and 31B. The sides 31A and 31B connect the bottom 31C and the non-displaced portions of the panels 23 and 26. The sides 31A and 31B slope at an angle of 45°. The bottom 31C has a length E. At respective corners of the rectangle of the bonding section 31, the metal wall of the panel 23 and the metal wall of the panel 26 are held in direct contact so that electrical connections 31D between the panels 23 and 26 are produced. Each of the electrical connections 31D has an effective area equal to the value "t1×t2". As shown in FIG. 10, the distance between the electrical connections 31D in a common longer side of the rectangle of the bonding section 31 is equal to the value "E+2t1".

The structure of the bonding sections 31 allows reliable mechanical connections between the panels 21–26 so that the heating box can be strong. The electrical connections 31D in the bonding sections 31 are in two parallel lines extending along each of the flanges of the panels 22–25. The largest distance between the adjacent electrical connections 31D in common line is smaller than a quarter wavelength of microwave used in the oven. These designs of the electrical connections 31D effectively prevent the leakage of microwave energy from the cooking space.

DESCRIPTION OF THE SECOND PREFERRED EMBODIMENT

Figure 12:
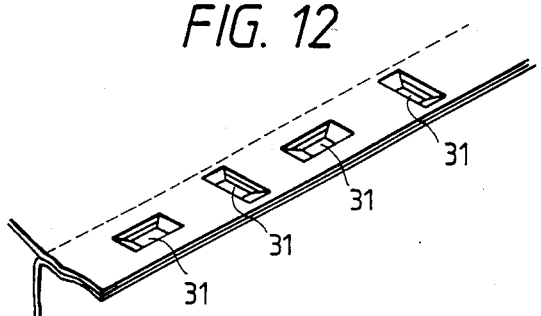
FIG. 12 is a perspective view of a portion of a heating box according to a second embodiment of this invention.

FIG. 12 shows a second embodiment of this invention which is similar to the embodiment of FIGS. 1–11 except for the following design change.

In the embodiment of FIG. 12, bonding sections 31 are alternately separated into two groups. The cut lines in the bonding section 31 in the first group are perpendicular to the cut lines in the bonding section 31 in the second group. This arrangement improves the strength of connections between panels.

DESCRIPTION OF THE THIRD PREFERRED EMBODIMENT

FIGS. 13–18 show a third embodiment of this invention which is similar to the embodiment of FIGS. 1–11 except for design changes indicated hereinafter. A heating box of the third embodiment is designed for a microwave oven equipped with a heater.

Figure 13:
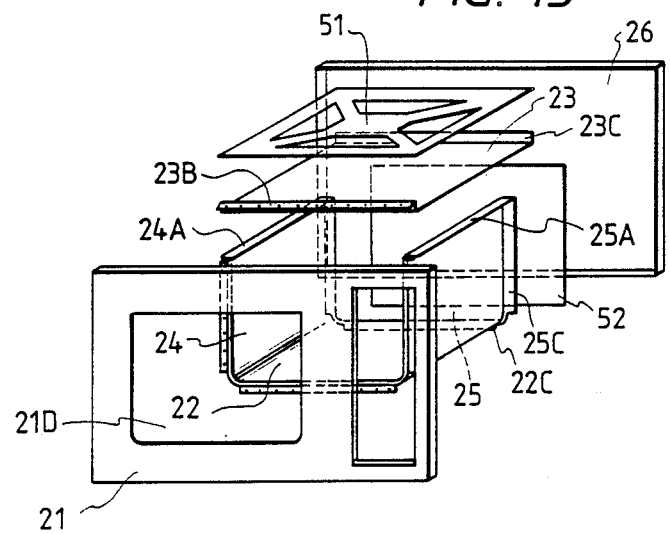
FIG. 13 is an exploded perspective view of a heating box according to a third embodiment of this invention under conditions which occur before processes of bonding panels are performed.
Figure 14:
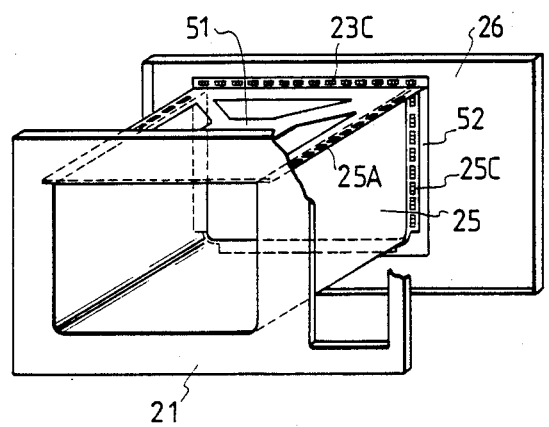
FIG. 14 is a perspective view of the heating box of the third embodiment under conditions where the panel bonding processes were completed and the heating box was assembled.

As shown in FIGS. 13 and 14, an auxiliary plate 51 is placed on an upper plate 23. In addition, an inner rear panel 52 is placed between an outer rear panel 26 and each of panels 22–25.

The connections between the panels 21–26, and 52 are designed and performed in similar manner. The connection between the side panel 25, the inner rear panel 52, and the outer rear panel 26 will be described in more detail hereinafter.

Figure 15:
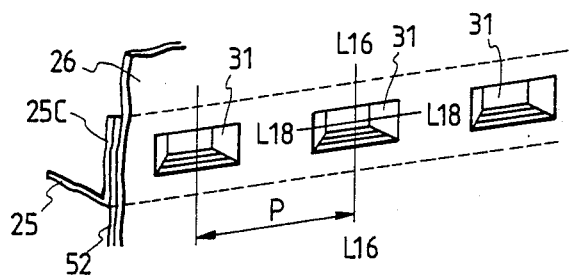
FIG. 15 is a perspective view of a portion of the heating box of FIG. 14.

As shown in FIG. 15, an edge of the panel 52 is sandwiched between the panel 26 and the flange 25C of the panel 25. The panels 25, 26, and 52 are fixed together at rectangular recessed bonding sections 31 extending in the flange 25C of the panel 25 and the corresponding parts of the panels 26 and 52. The bonding sections 31 are spaced at equal pitches P in a longitudinal direction of the flange 25C. The pitch P between the bonding sections 31 is preferably smaller than a quarter wavelength of microwave used in the oven. The bonding sections 31 are formed in a method similar to the method in the embodiment of FIGS. 1–11.

Figures 16, 17:
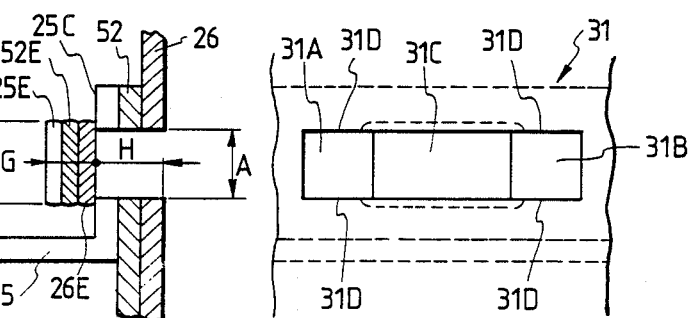
FIG. 16 is a sectional view taken along the line L16—L16 of FIG. 15.
FIG. 17 is a plan view of the bonding section of FIG. 16.

As shown in FIG. 16, in the bonding section 31, a cut opening in non-displaced portions of the panels 25, 26, and 52 has a width A. Portions 25E, 26E, and 52E of the panels 25, 26, and 52 were displaced by a distance H corresponding to a depth of the cut opening. The displaced and deformed portions 25E, 26E, and 52E has a width F and a thickness G. The non-displaced portion of the panel 25 has a thickness t1. The non-displaced portion of the panel 52 has a thickness t2. The non-displaced portion of the panel 26 has a thickness t3. The width F of the displaced and deformed portions 25E, 26E, and 52E of the panels 25, 26, and 52 is preferably chosen so as to satisfy the following relationship.

$$F \geq A + \{2(t1+t2+t3)/3\}$$

The thickness G of the displaced and deformed portions 25E, 26E, and 52E of the panels 25, 26, and 52 is preferably chosen so as to satisfy the following relationship.

$$G \leq 0.8(t1+t2+t3)$$

The depth H is preferably chosen so as to essentially equal to the sum of the thicknesses t1, t2, and t3.

Figure 18:
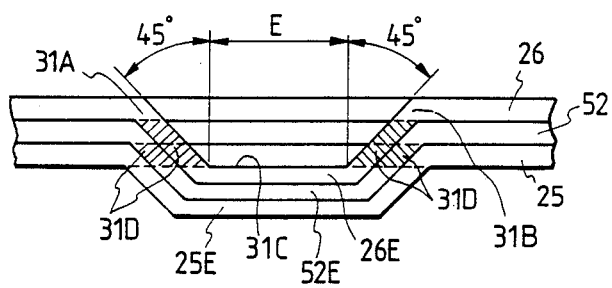
FIG. 18 is a sectional view taken along the line L18—L18 of FIG. 15.

As shown in FIGS. 17 and 18, the bonding section 31 has a recessed structure having a pair of sides 31A and 31B and a rectangular flat bottom 31C defined by the displaced and deformed portions 25E, 26E, and 52E of the panels 25, 26, and 52. The bottom 31C extends between the sides 31A and 31B. The sides 31A and 31B connect the bottom 31C and the non-displaced portions of the panels 25, 26, and 52. The sides 31A and 31B slope at an angle of 45°. The bottom 31C has a length E. At respective corners of the rectangle of the bonding section 31, electrical connections 31D between the panels 25, 26, and 52 are produced. Each of the electrical connections 31D has an effective area equal to the value "$\{t1 \times t2 + t3(t1+t2)\}$".

What is claimed is:

1. A heating box the interior of which is exposed to energy in the form of microwaves, comprising:
   a first metal panel having a joint portion;
   a second metal panel having a joint portion which opposes and contacts the joint portion of the first panel; and
   means for bonding the first and second panels together at said joint portions thereof,
   said bonding means comprising means for mechanically connecting the first and second panels, and means for electrically connecting the first and second panels, wherein said mechanically connecting means comprises opposing parts extending between two lines along which said joint portions of the first and second panels are cut and forcibly deformed together away from said joint portions such that said forcible deformation causes a mechanical connection of said first and second panels thereat, and wherein said electrically connecting means extends across the thickness of said cut and deformed opposing parts of said joint portions of the mechanically connected first and second panels.

2. The heating box according to claim 1, wherein: said electrically connecting means extends adjacent to said cut and deformed opposing parts of the joint portions of the first and second panels.

3. The heating box according to claim 1, wherein: said mechanically connecting means comprises a plurality of said mechanical connections between the joint portions of the first and second panels, spaced apart at a pitch not greater than a quarter of the wavelength of the microwaves to which the interior of the heating box is exposed.

4. A heating box according to claim 1, wherein: said deformed portions of said joint portions are made larger in a final width B than a corresponding initial width A of an opening formed by said cut in said first and second panels between said lines to obtain said bonding between said first and second panels at said joint portions thereof.

5. A heating box according to claim 4, wherein: said widths A and B are selected to satisfy a relationship $B \geq A + \{2(t1+t2)/3\}$, where t1 and t2 are the respective thicknesses of said first and second panels in their undeformed state.

6. A heating box according to claim 5, wherein: an overall total thickness C of said deformed portions satisfies a relationship $C \leq 0.8(t1+t2)$.

7. A heating box according to claim 6, wherein: said cut is selected to form a rectangular opening through both of said panels, and the metal walls of said panels are held in direct contact with each other to produce electrical connections therebetween each having an effective area preferably equal to $(t1 \times t2)$.

8. A heating box according to claim 6, wherein: said electrical connections are disposed in two lines and the maximum distance between adjacent electrical connections in a common line is smaller than a quarter of the wavelength of the microwaves to which the interior of the heating box is exposed.

9. A heating box according to claim 4, wherein: an overall total thickness C of said deformed portions satisfies a relationship $C \leq 0.8(t1+t2)$, where t1 and t2 are the respective thicknesses of said first and second panels in their undeformed state.

10. A heating box according to claim 1, wherein: said first and second panels have respective undeformed thicknesses t1 and t2 respectively, said cut is selected to form a rectangular opening through both of said panels, and the metal walls of said panels are held in direct contact with each other to produce electrical connections therebetween each having an effective area preferably equal to $(t1 \times t2)$, where t1 and t2 are the respective thicknesses of said first and second panels in their undeformed state.

11. A heating box according to claim 10, wherein: said electrical connections are disposed in two lines and the maximum distance between adjacent electrical connections in a common line is smaller than a quarter of the wavelength of the microwaves to which the interior of the heating box is exposed.

12. A heating box according to claim 1, wherein: said electrical connections are disposed in two lines and the maximum distance between adjacent electrical connections in a common line is smaller than a quarter of the wavelength of the microwaves to which the interior of the heating box is exposed.

13. A heating box according to claim 1, wherein: said bonding means comprises two groups of generally similar mechanical connecting means disposed in an alternating array with the cut lines of one group being oriented perpendicular to corresponding cut lines of the other of said two groups.

14. A heating box according to claim 1, further comprising:
an auxiliary plate provided on the outside of said heater box at an upper wall thereof and an inner rear panel provided between said first panel serving as an outer rear panel and side panels each respectively serving as said second panel to form heater box side walls perpendicular thereto, said bonding means comprising cuts through said inner rear panel in correspondence with said cuts in said first and second panels for said bondings thereof.

15. A heating box according to claim 14, wherein: said mechanical connections are spaced apart at a pitch not greater than a quarter of the wavelength of the microwaves to which the interior of the heater box is exposed.

16. A heating box according to claim 14, further comprising:
a heater.

17. A heating box the interior of which is exposed to energy in the form of microwaves, comprising:
a first metal panel having a joint portion;
a second metal panel having a joint portion which opposes and contacts said joint portion of said first panel; and
means for bonding said first and second panels together at said joint portions thereof, said bonding means comprising a plurality of means for electrically connecting said first and second panels, said plurality of electrically connecting means being disposed at different predetermined distances in a direction from said interior to an exterior of the heating box, said plurality of electrically connecting means each extending across the thickness of said joint portions of said electrically connected first and second panels.

18. A heating box the interior of which is exposed to energy in the form of microwaves, comprising:
a first metal panel having a joint portion;
a second metal panel having a joint portion which opposes and contacts said portion of said first panel; and
means for bonding said first and second panels together at said joint portions thereof, said bonding means comprising means for electrically connecting said first and second panels, and means for ensuring electrical connection between the first and second panels across the thicknesses of said joint portions thereof, said ensuring means comprising opposing parts of the joint portions of said first and second panels, said opposing parts extending between two lines along which said joint portions of the first and second panels are cut, and said opposing parts being forcibly displaced in the direction of said thicknesses of the first and second panels and pressed together.

19. A heating box according to claim 18, wherein: said pressed together parts are deformed so as to have a plurality of electrical connections disposed along said two lines such that the maximum distance between adjacent electrical connections in a common line is smaller than a quarter of the wavelength of the microwaves to which the interior of the heating box is exposed.

* * * * *